(12) United States Patent
Dewey et al.

(10) Patent No.: US 8,890,264 B2
(45) Date of Patent: Nov. 18, 2014

(54) NON-PLANAR III-V FIELD EFFECT TRANSISTORS WITH CONFORMAL METAL GATE ELECTRODE AND NITROGEN DOPING OF GATE DIELECTRIC INTERFACE

(71) Applicants: Gilbert Dewey, Hillsboro, OR (US); Robert S. Chau, Beaverton, OR (US); Marko Radosavljevic, Beaverton, OR (US); Han Wui Then, Portland, OR (US); Scott B. Clendenning, Portland, OR (US); Ravi Pillarisetty, Portland, OR (US)

(72) Inventors: Gilbert Dewey, Hillsboro, OR (US); Robert S. Chau, Beaverton, OR (US); Marko Radosavljevic, Beaverton, OR (US); Han Wui Then, Portland, OR (US); Scott B. Clendenning, Portland, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/627,971

(22) Filed: Sep. 26, 2012

(65) Prior Publication Data

US 2014/0084387 A1  Mar. 27, 2014

(51) Int. Cl.
*H01L 29/78* (2006.01)
*H01L 29/66* (2006.01)
*H01L 29/06* (2006.01)
*H01L 21/02* (2006.01)
*H01L 21/28* (2006.01)

(52) U.S. Cl.
USPC ........... 257/410; 257/288; 257/330; 257/347; 438/299; 438/478; 438/151

(58) Field of Classification Search
USPC .......... 257/410, 288, 330, 347; 438/261, 299, 438/478, 151
See application file for complete search history.

(56) References Cited

U.S. PATENT DOCUMENTS

| | | | |
|---|---|---|---|
| 5,986,291 A * | 11/1999 | Currie et al. | 257/194 |
| 6,921,700 B2 | 7/2005 | Orlowski et al. | |
| 7,253,061 B2 | 8/2007 | Peng et al. | |
| 7,655,994 B2 | 2/2010 | Cartier et al. | |
| 2004/0113210 A1* | 6/2004 | Chau et al. | 257/401 |
| 2005/0275010 A1* | 12/2005 | Chen et al. | 257/315 |
| 2007/0004224 A1* | 1/2007 | Currie | 438/778 |
| 2007/0152238 A1* | 7/2007 | Matocha et al. | 257/192 |
| 2008/0203430 A1* | 8/2008 | Simin et al. | 257/192 |
| 2008/0233694 A1* | 9/2008 | Li | 438/216 |
| 2008/0274625 A1* | 11/2008 | Ahn et al. | 438/785 |
| 2009/0152532 A1* | 6/2009 | Takeuchi et al. | 257/40 |
| 2009/0321717 A1* | 12/2009 | Pillarisetty et al. | 257/24 |

(Continued)

OTHER PUBLICATIONS

"GaN Stripes on Vertical {111} Fin Facets of (110)-Oriented Si Substrates," by Kuryatkov et al., Applied Physics Letters 96, 073107 (2010), 4 pages.

*Primary Examiner* — Shaun Campbell
*Assistant Examiner* — Thai T Vuong
(74) *Attorney, Agent, or Firm* — Blakely, Sokoloff, Taylor & Zafman LLP (57) ABSTRACT

A high-k gate dielectric interface with a group III-V semiconductor surface of a non-planar transistor channel region is non-directionally doped with nitrogen. In nanowire embodiments, a non-directional nitrogen doping of a high-k gate dielectric interface is performed before or concurrently with a conformal gate electrode deposition through exposure of the gate dielectric to liquid, vapor, gaseous, plasma, or solid state sources of nitrogen. In embodiments, a gate electrode metal is conformally deposited over the gate dielectric and an anneal is performed to uniformly accumulate nitrogen within the gate dielectric along the non-planar III-V semiconductor interface.

13 Claims, 8 Drawing Sheets

(56) References Cited

U.S. PATENT DOCUMENTS

| | | |
|---|---|---|
| 2010/0052071 A1* | 3/2010 | Niimi et al. .................. 257/369 |
| 2010/0059807 A1 | 3/2010 | Cho et al. |
| 2010/0155701 A1* | 6/2010 | Radosavljevic et al. ........ 257/24 |
| 2010/0276668 A1* | 11/2010 | Ko et al. .......................... 257/24 |
| 2010/0295021 A1 | 11/2010 | Chang et al. |
| 2011/0133168 A1* | 6/2011 | Dewey et al. .................. 257/24 |
| 2011/0223728 A1* | 9/2011 | Li ................................. 438/216 |
| 2011/0298060 A1* | 12/2011 | Chen et al. ................... 257/410 |

* cited by examiner

NON-PLANAR III-V FIELD EFFECT TRANSISTORS WITH CONFORMAL METAL GATE ELECTRODE AND NITROGEN DOPING OF GATE DIELECTRIC INTERFACE

TECHNICAL FIELD

Embodiments of the invention are in the field of semiconductor devices and, more particularly to non-planar field effect transistors (FET) employing group III-V semiconductors.

BACKGROUND

Non-planar transistors which utilize a body of semiconductor material protruding from a substrate surface employ a gate electrode that wraps around two, three, or even all sides of the semiconductor body (i.e., dual-gate, tri-gate, nanowire transistors, respectively). Source and drain regions are formed in the body, or as re-grown portions coupled to the body, on either side of the gate electrode.

With the introduction of high-k gate dielectrics, reliable gate control of a semiconductor channel region between the source and drain regions is difficult to achieve for non-planar devices even where the channel semiconductor is silicon. For a group III-V FET, which employs a III-V compound semiconductor for a transistor channel region, gate control is all the more elusive. The metal-oxide-semiconductor (MOS) interfaces associated such materials are much less studied than their silicon counterparts, and much less well-behaved (e.g., suffering poor quality native oxides, sub-stoichiometric surfaces, etc.).

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

III-V field effect transistors (FETs) with nitrogen-doped gate dielectric interfaces and conformal gate electrodes are described. In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over (above) or under (below) another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two adjacent features may be in direct contact with the adjacent features or may have one or more intervening features.

Disclosed herein are III-V semiconductor devices utilizing a gate dielectric with non-directional nitrogen doping to form metal-oxide-semiconductor (MOS)-type (or metal-insulator-semiconductor) devices. While the nitrogen doped gate dielectric is describe herein as disposed in a non-planar FET, it should be appreciated that the embodiments so described may be readily adapted to other capacitively-coupled device designs which employ a similar dielectric material interfacing with a III-V semiconductor surface (e.g., MOS capacitors, etc.). Furthermore, the techniques and structures described herein may also be adapted to passivation of III-V semiconductor surfaces for low leakage, etc.

For III-V semiconductor materials, which lack a good quality native oxide, FET structures in embodiments of the present invention entail a transition from a top III-V semiconductor surface to a non-native high-k gate dielectric. The inventors have found that the amount of trapped charge present at the interface of a high-k gate dielectric and III-V semiconductor can be reduced by nitrogen doping the gate dielectric proximal the interface for better gate control than is otherwise possible. In highly scaled, non-planar FET embodiments (e.g., double gate, tri-gate, gate all around nanowires), good gate control has been achieved with a conformal high-k gate dielectric, a conformal nitrogen doping of the high-k gate dielectric at the interface with the III-V semiconductor, and a conformal metal gate electrode. With proper nitrogen doping of the dielectric proximal all gated semiconductor surfaces, interface trap density is uniformly low at the gated semiconductor surfaces and there is reduced oxidation the semiconductor surfaces during subsequent processing of the FET. Due to the presence of shadowed surfaces in such non-planar FETs, non-directional nitrogen doping is advantageous to uniformly treat all semiconductor interfaces of the conformal high-k gate dielectric. In embodiments, properties of the metal gate electrode and the gate dielectric interface may further benefit from nitrogen doping of the gate dielectric.

Figure 1A:
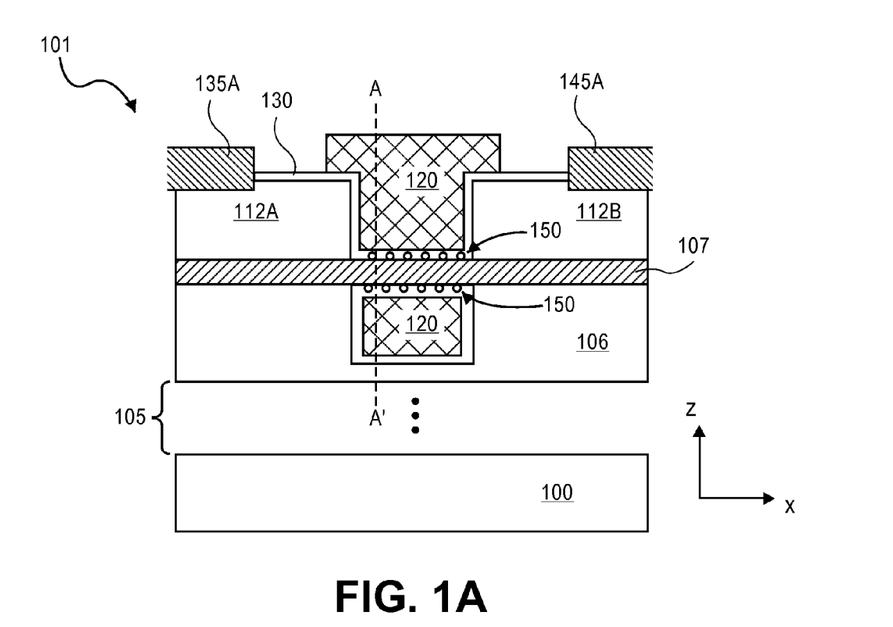
FIG. 1A illustrates a first cross-sectional view of a group III-V field effect transistor (FET), in accordance with an embodiment of the present invention.

FIG. 1A illustrates a first cross-sectional view of a group III-V field effect transistor (FET) 101, in accordance with an embodiment of the present invention. The FET 101 is formed over a substrate 100 composed of any material suitable for semiconductor device fabrication. In one embodiment, substrate 102 is a bulk substrate composed of a (single) crystalline material which may include, but is not limited to, silicon (e.g., 100 silicon), germanium, silicon-germanium, silicon carbide, sapphire, a III-V compound semiconductor, or the like.

Disposed over the substrate 100 is one or more semiconductor base layers 105, such as but not limited to pseudomorphic, metamorphic, or substantially lattice matched buffer layers and/or transition layers, as known in the art. Disposed over the one or more semiconductor base layers 105 is a bottom device layer 106. In the exemplary embodiment, the bottom device layer 106 is a bottom barrier layer having a band gap that is wider than that of an overlying channel layer 107 for the sake of carrier confinement and/or reduced device leakage. In other embodiments, the bottom device layer 106 merely has a composition different enough from that of the channel layer 107 that a selective etch of the bottom device layer may be performed to fully expose all sides of the channel layer 107 (i.e., form a nanowire).

In embodiments, both the bottom device layer 106 and the channel layer 107 are each substantially single crystalline compound semiconductors including elements from group III (e.g. boron, aluminum, gallium or indium) and V (e.g. phosphorous, arsenic or antimony). In the exemplary embodiments, the channel layer 107 is composed of binary compounds, but not limited to, InP, InAs, InSb, or GaAs, ternary compounds, such as, but not limited to, InAsSb, InGaAs, InAlAs or AlGaAs, or quaternary compounds such as, but not limited to, InGaAsSb, InAlAsSb, or InAlGaAs. In further embodiments, the bottom device layer 106 may be any of these same compounds with potentially varying constituent ratios for a desired band gap and/or lattice spacing. For example, in one embodiment the bottom device layer 106 is of a different composition than the channel layer 107 such that the device layer 106 has a larger band gap, or a least a conduction band offset, relative to the band gap of the channel layer 107. In certain such embodiments, the channel layer 107 is lattice matched to the bottom device layer 106 and in other embodiments the channel layer 107 is lattice mismatched (e.g., a strained pseudomorphic epitaxial layer) to the bottom device layer 106. Although not depicted in FIG. 1A, a top semiconductor barrier layer may also be present, though not necessarily, which is composed of a III-V material suitable to confine carriers within the channel layer 107.

In embodiments, a gate stack including at least a gate dielectric layer and an overlying gate electrode conformally wraps around a non-planar III-V semiconductor channel surface. As shown in FIG. 1A, a gate dielectric layer 130 and a gate electrode 120 wrap around a bottom semiconductor surface of the channel layer 107 such that the channel layer 107 forms a nanowire spanning a distance between a source region 112A and a drain region 112B, which are coupled to the external world through contact metallizations 135A, 145A, respectively. The maximum z-thicknesses of both the channel layer 107 and the bottom device layer 106 may vary considerably. For certain embodiments, the channel layer 107 has a z-thickness between 2 nm and 10 nm. The bottom device layer 106 may generally be somewhat thicker to allow space for gate stack materials to underfill below the channel layer 107. Although the bottom device layer 106 is illustrated as thick enough to allow both a gate dielectric layer 130 and a gate electrode 120 to pass through a void in the bottom device layer 106, embodiments where the bottom device layer has a thickness somewhat less than a 4 nm-40 nm z-height of the backfilled wrap around gate electrode are also possible. For example, where multiple distinct semiconductor material layers are present the bottom device layer 106 and an underlying layer may be etched to form a void that is then backfilled with the gate stack.

Although only a single channel layer 107 is illustrated in Figure A for the sake of clarity, it is noted the channel layer 107 may be replicated to form a vertical stack of two or more such semiconductor channels with an intervening semiconductor channel spacing layer (e.g., having a thickness of 4 nm-40 nm) that is removed to permit backfilling of the gate dielectric and gate electrode layers between adjacent channel layers. It is noted the teachings herein provided in the context of a single channel nanowire are directly applicable to such stacked nanowire channel FET embodiments.

Figure 1B:
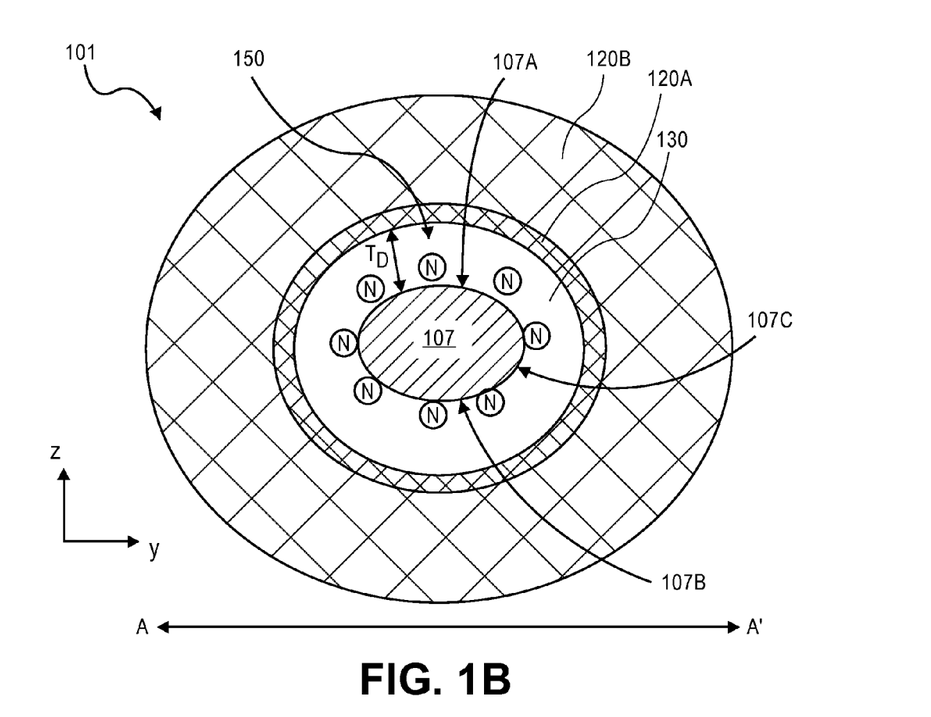
FIG. 1B illustrates a second cross-sectional view of the group III-V FET illustrated in FIG. 1A, in accordance with an embodiment of the present invention.

FIG. 1B illustrates a second cross-sectional view of the group III-V FET illustrated in FIG. 1A along the a-a' plane, in accordance with an embodiment of the present invention. As shown, the channel layer 107 forms a wire of arbitrary shape (e.g., of rectangular, circular, etc.) having a top surface 107A, a bottom surface 107B, and sidewalls surfaces 107C there between. The gate dielectric 130 conformally wraps around the channel layer 107 forming a sheath of insulation that interfaces with all the channel layer surfaces (e.g., 107A, 107B, 107C). The gate electrode 120 similarly wraps conformally around the gate dielectric 130.

In exemplary embodiments, the gate electrode 120 is metal. Metal gate electrode embodiments include electrodes of a homogenous composition, or as further illustrated in FIG. 1B, in the form of a gate electrode stack including both a work function metal layer 120A and a bulk fill metal layer 120B disposed over, or directly on, the work function metal layer. For the bulk metal 120B, any highly conductive metal known in the art for such purposes may be utilized, such as but not limited to, tungsten (W), Al, gold (Au) or copper (Cu). Generally, the work function metal may be any metal having a suitable work function to achieve a predetermined voltage threshold ($V_t$) for the FET. In embodiments, the work function metal 120A is other than a compound of nitrogen (i.e., not a metal nitride (M-N)). In certain such embodiments any nitrogen present is far below stoichiometric levels and for reasons further described elsewhere herein, in embodiments where detectable levels of nitrogen are present in the work function metal 120A, the amount of nitrogen is greatest at the gate electrode metal interface with the gate dielectric layer 130, reducing to trace levels within the work function metal 120A and/or bulk metal 120B at points distal from the gate dielectric interface. For example, a nitrogen concentration gradient within the gate metal may be consistent with one expected from a diffusion of nitrogen up from the metal interface with the gate dielectric. In exemplary n-type enhancement mode FET embodiments, the work function metal 120A includes at least one of ruthenium (Ru), cobalt (Co), iridium (Jr), nickel (Ni), palladium (Pd), or platinum (Pt). Other metals and alloys thereof displaying similarly high work functions may also be employed. For a p-type enhancement mode FET embodiment, the work function metal 120A may be one or more of Al, Ti, or Ta, as well as other metals and their alloys displaying similarly low work functions.

For the particular embodiment depicted in FIG. 1B where the channel layer 107 best approximates an elliptical transverse cross-section (although such corner rounding may not occur to such an extent as a function of the y and z dimensioning of the channel layer and processing), the gate dielectric 130 has an annular cross-section. As gate control of the channel layer 107 is a function of the dielectric, in embodiment the dielectric thickness is $T_d$ both above the top channel semiconductor surface 107A and below the bottom channel semiconductor surface 107B. Although the dielectric thickness $T_d$ may vary, the exemplary range is 1 nm-10 nm. To achieve the uniform dielectric thickness $T_d$ at all channel layer surfaces, a highly conformal dielectric deposition process is advantageous, with the gate dielectric layer 130 formed by atomic layer deposition (ALD) for the exemplary embodiment.

In embodiments the gate dielectric layer 130 is a high-K material comprising a metal oxide, such as, but not limited to, one or more of aluminum (Al), tantalum (Ta), hafnium (Hf), zirconium (Zr), lanthanum (La), or titanium (Ti). In one metal oxide embodiment, a III-IV metal oxide is employed. Group III metals include any of aluminum (e.g., $Al_2O_3$), gallium or indium. The group IV element is either silicon to form a group III silicate (e.g., $AlSiO_x$) or germanium to form a group III germanate. In another metal silicate embodiment, the gate dielectric 130 is silicon and an oxygen ligand with one or more of the metals Ta, Hf, Zr, La, or Ti (i.e., $TaSiO_x$, $HfSiO_x$, $ZrSiO_x$, $TiSiO_x$, $LaSiO_x$, for example.

For metal silicate embodiments, the silicon content may be varied to achieve a high quality interface with the underlying III-V semiconductor and to arrive at a desired effective dielectric constant for the gate dielectric 130. As such, the metal silicate may either be a stoichiometric film or sub-stoichiometric film with respect to either silicon or oxygen. For example, in one aluminum silicate embodiment, an amount of silicon may be added to achieve a stoichiometric aluminum orthosilicate ($Al_4(SiO_4)_3$) film. In an alternative embodiment employing an aluminum silicate with a sub-stoichiometric amount of silicon, the ratio of silicon:aluminum is less than that of the stoichiometric film. Similarly, a stoichiometric tantalum silicate ($Ta_4(SiO_4)_5$) or a sub-stoichiometric tantalum silicate, having a smaller silicon:tantalum ratio than the stoichiometric film, may be employed. As such, a wide range of dielectric constants may be achieved by varying the silicon content of a film containing one or more of the metallic constituents described herein.

Figure 1C:
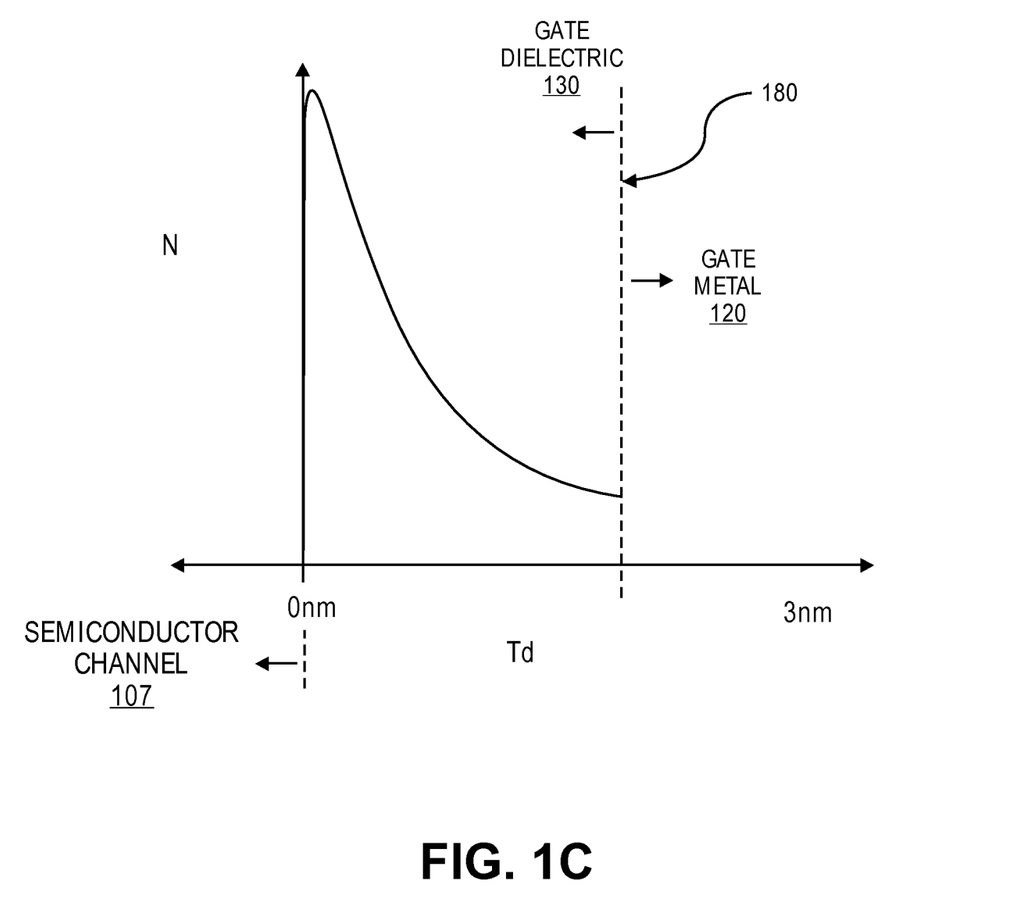
FIG. 1C is a plot illustrating nitrogen accumulation in a high-k gate dielectric at a III-V semiconductor interface, in accordance with embodiments of the present invention.

In embodiments, the gate dielectric layer 130 is doped with nitrogen 150, or is "nitrided." Incorporation of nitrogen into the gate dielectric in regions proximal to a gated semiconductor surface has been found to reduce the amount of trapped charge present at the interface of the gate dielectric 130 and III-V semiconductor channel layer 107 such that gate control of the channel of the FET 101 is improved. Generally, for metal oxide gate dielectric embodiments, it is currently thought that nitrogen replaces an oxygen. As shown in FIG. 1B, the nitrogen doping is non-directional, such that nanowire embodiments include a nitrogen doped gate dielectric region also wrapping around at least a portion of the channel layer 107, and advantageously wrapping completely around the channel layer 107. Although in some embodiments nitrogen may be present uniformly throughout the dielectric thickness $T_d$, in the exemplary embodiment the nitrogen content within the gate dielectric layer 130 is not homogeneous throughout the dielectric thickness $T_d$, but rather accumulates proximal to the interface of the III-V semiconductor surface of the channel layer 107. FIG. 1C is a plot qualitatively illustrating nitrogen accumulation at an III-V semiconductor interface of a high-k gate dielectric. As shown, nitrogen within the gate dielectric layer 130 is present in greatest quantity proximal to the interface of the channel semiconductor interface. Noting embodiments herein do have extremely small gate dielectric thicknesses, $T_d$, energy electron loss spectroscopy (EELS) is one analytical technique which may be utilized to differentiate the nitrogen level of the gate dielectric layer 130 proximal to the interface of the channel layer 107 to that at a point more distal from the channel layer 107, for example at the interface of the gate electrode 120.

Although not bound by theory, it is currently thought the presence of dangling bonds at the interface between the semiconductor channel layer 107 and the gate dielectric 130 associated with a trap density of energy states are passivated by the nitrogen dopant, leading to this accumulation of interface nitrogen within the gate dielectric layer 130. Even for embodiments with such channel interface accumulation, some amount of nitrogen can be expected throughout the gate dielectric thickness $T_d$, particularly as the thickness is reduced toward 1 nm. In metal silicate gate dielectric embodiments (e.g., $HfSiO_x$) therefore, nitrogen doping renders the gate dielectric material $HfSiO_xN_y$ and with y being a function of dielectric thickness in further embodiments where y is greatest (i.e., relatively nitrogen-rich) proximate to the channel layer 107. Similarly, for non-silicate metal oxide embodiments (e.g., $HfO_2$, etc.) nitrogen doping renders the gate dielectric material $HfO_xN_y$ and with y being a function of dielectric thickness in further embodiments where y is greatest (i.e., relatively nitrogen-rich) proximate to the channel surfaces (e.g., 107A, 107B, 107C).

Figure 1D:
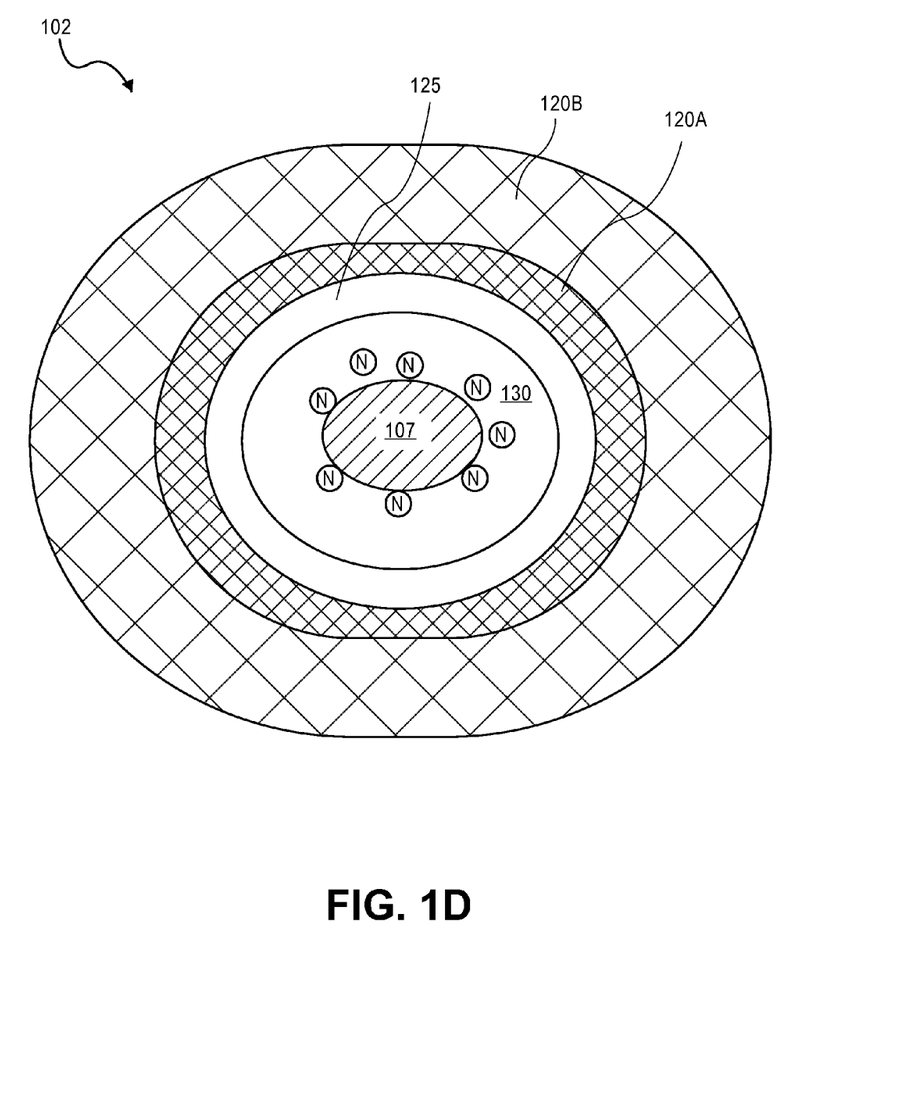
FIG. 1D illustrates a second cross-sectional view of the group III-V FET illustrated in FIG. 1A, in accordance with an embodiment of the present invention.

Depending on the technique employed to incorporate nitrogen into the gate dielectric, a nitrogen source material may further be present in embodiments of a III-V FET. For example in one embodiment where solid state diffusion is employed for nitrogen doping of the gate dielectric layer, a conformal metal nitride layer is disposed between the gate electrode and the gate dielectric to serve as a non-directional, isometric solid state source of nitrogen for doping the gate dielectric. FIG. 1D illustrates a second cross-sectional view of the group III-V FET 101 for such an embodiment. As shown, a metal nitride layer 125 is a conformal layer wrapping completely around the gate dielectric and form an interface with the gate dielectric within a channel region of the FET 101.

Generally, the metal nitride is to be of a thickness that does not preclude the work function metal 120A from setting the gate electrode work function. The composition of the work function metal 120A may be selected such that a desired work function is achieved in the presence of the metal nitride layer 125. For embodiments including the metal nitride layer 125, a desired gate electrode work function may be set with a non-nitrided metal. Also, because the metal nitride layer 125 may not have high conductivity, it is not described herein as being part of the metal gate electrode, but rather an interface layer between the gate electrode and the gate dielectric. In embodiments where the metal nitride layer 125 does have good conductivity, it may be considered a bottom, or first, layer of the gate electrode stack.

While the metal nitride layer 125 allows the work function metal to be optimized without the further constraint of also needing to serve as a nitrogen source, if a metal nitride is employed as a work function metal, the metal nitride layer 125 and work function metal 120A would then be a single material layer. The metal nitride layer 125 may include any metal for which non-directional deposition techniques (e.g., ALD, plasma enhanced ALD) are applicable. In exemplary embodiments, the metal nitride layer 125 includes at least one of Ti, Va, Mo, Ta, or W. For embodiments employing the metal nitride layer 125, the gate metal/gate dielectric interface 180 depicted in FIG. 1D is occupied by the metal nitride layer 125.

Figure 2:
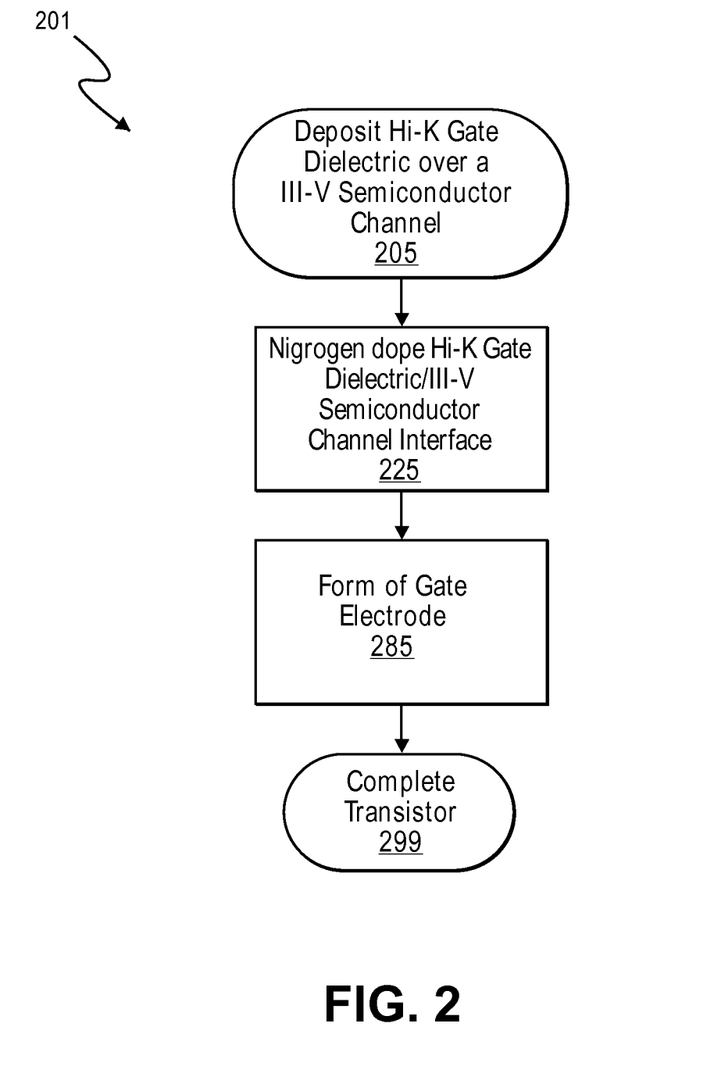
FIG. 2 is a flow diagram illustrating operations in a method for forming a III-V FET, in accordance with an embodiment of the present invention.

With structural features of the exemplary III-V FET embodiments introduced, further description of fabrication techniques are now provided, particularly with respect to nitrogen doping the gate dielectric/III-V semiconductor channel interface. FIG. 2 is a general flow diagram illustrating operations in a method 201 for forming a III-V FET, in accordance with an embodiment of the present invention. The method 201 begins with deposition of a non-native, high-K dielectric in direct contact with an exposed III-V semiconductor channel surface to form a gate dielectric layer. Generally, any technique known in the art may be used to deposit the gate dielectric depending on the dielectric material composition. In the exemplary embodiments nanowire channel embodiments, any of the gate dielectric materials described elsewhere in the context of FET 101 are deposited by ALD to form a conformal interface between the gate dielectric and all exposed III-V semiconductor surfaces.

At operation 225, the gate dielectric is nitrogen doped by exposing the deposited gate dielectric layer to a liquid, vapor, gaseous, plasma, or solid state source of nitrogen. Nitrogen doping of the gate dielectric after the gate dielectric is deposited has been found to provide lower interface trap density ($D_{it}$) than if nitrogen is incorporated into the gate dielectric concurrently with the dielectric deposition. For example, a nitrogen exposure of the gate dielectric surface providing only an indirect exposure of the III-V semiconductor surface is preferable over a direct nitrogen exposure of the III-V semiconductor before a gate dielectric layer (e.g., metal oxide) is deposited on the semiconductor surface, or currently with gate dielectric deposition. Following nitrogen exposure, the method 201 proceeds to form the gate electrode at operation 285. For example, with deposition of a work function metal (e.g., any of those described elsewhere herein) and/or a bulk metal cap. In certain embodiments, as described further elsewhere herein, the nitrogen exposure may be performed concurrently with the gate electrode formation at operation 285, such that the operations in method 201 need not be performed in a serial manner.

The method 201 then completes with other elements of the FET being completed using any techniques conventional to the art, such as forming a source region and drain region on opposite sides of the gate electrode as illustrated by FIG. 1A. Notably, at some point during completion of the FET at operation 299 a thermal anneal is performed during which the nitrogen dopant is diffused within the gate dielectric toward the III-V semiconductor interface where the nitrogen may accumulate and further passivate the semiconductor-insulator interface. Generally, this thermal anneal may be performed anywhere in the manufacturing flow subsequent to the deposition of at least a layer of the gate electrode at operation 285. With the gate electrode material serving as a cap, nitrogen doping of the gate dielectric proximal to the III-V semiconductor interface can proceed with minimal out diffusion of nitrogen. As such, one or more subsequent thermal processes (e.g., source/drain regrowth in a gate-first process or conventional end of line $N_2$ final anneal in a gate-last process) may additionally serve as the thermal anneal operation 490.

Figure 3:
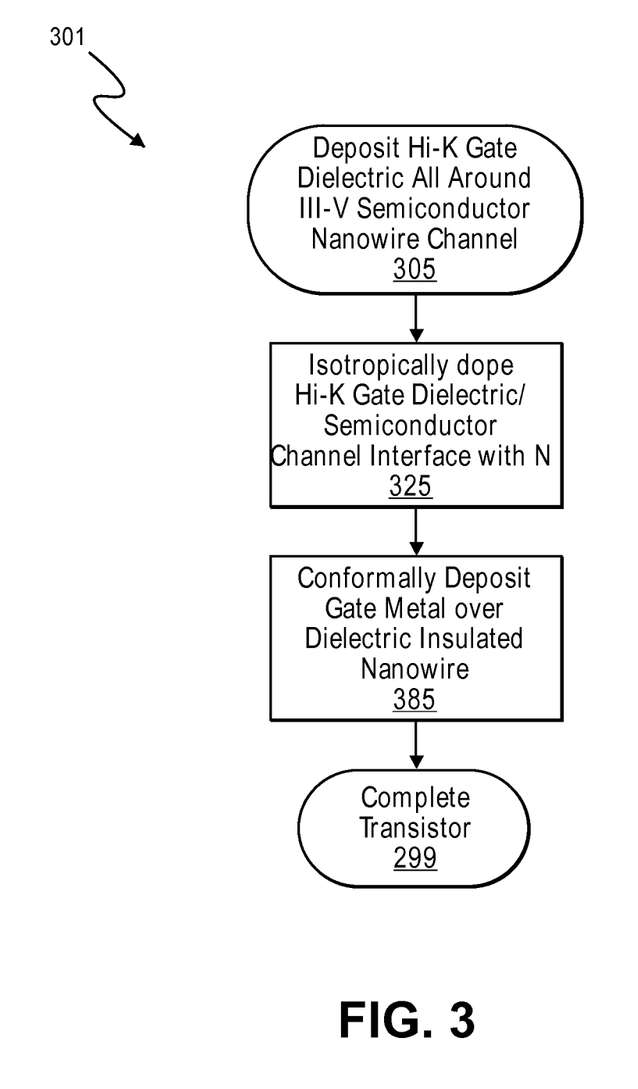
FIG. 3 is a flow diagram illustrating operations in a method for forming a nanowire III-V FET, in accordance with an embodiment of the present invention.

FIG. 3 is a flow diagram more specifically illustrating operations in a method 301 for forming a nanowire III-V FET, in accordance with an embodiment of the present invention. The method 301 begins with depositing the gate dielectric all around a III-V semiconductor nanowire channel surface. In one embodiment, any of the metal oxide/metal silicate embodiments described elsewhere herein are deposited by ALD to conformally surround the III-V nanowire. At operation 325, the gate dielectric is then isotropically doped through a non-directional exposure process. The non-directional exposure conformally exposes the conformal gate dielectric surface to a nitrogen source. The non-directional exposure may be accomplished through the use of a wet solution, vapor phase, plasma-based processing, solid phase, or any combination thereof.

Figure 4:
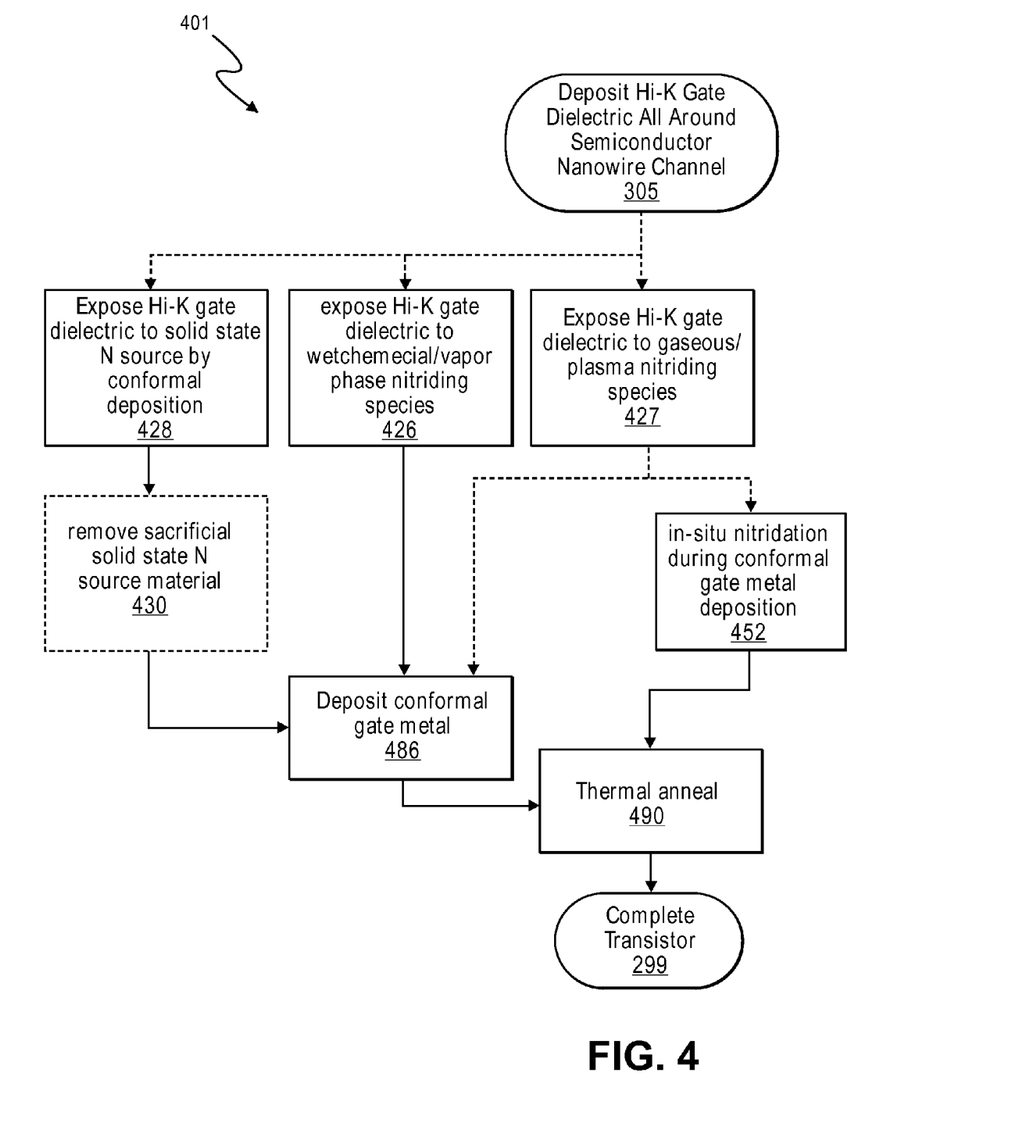
FIG. 4 is a flow diagram illustrating operations in a method for non-directionally doping a high-K gate dielectric interface to a III-V semiconductor, in accordance with embodiments of the present invention.

FIG. 4 is a flow diagram illustrating operations in a method 401 for non-directionally doping a gate dielectric interface to III-V semiconductor, in accordance with embodiments of the present invention. One or more of the techniques described in the context of FIG. 4 may be performed at operation 325 of FIG. 3, and more generally at operation 225 of FIG. 2. The method 401 begins with the conformal gate dielectric deposition operation 305 followed by exposure to at least one of: a liquid/vapor phase nitrogen source at operation 426; a gaseous or plasma nitrogen source at operation 427; or deposition of a material to serve as a solid phase nitrogen source at operation 428. Each of these nitriding operations may be performed in the alternate, as denoted by the dashed lines, or performed in combination.

In an embodiment, at operation 426 the gate dielectric layer is exposed to a nitriding solution, such as, but not limited to, a hydrazine solution. Hydrazine solutions, such as, but not limited to, $N_2H_4$, dimethylhydrazine, or tertbutylhydrazine may be applied to the gate dielectric surface at temperatures between 25° C. and 100° C. Because of the minute geometries, aqueous solutions of hydrazine may be advantageously provided in a supercritical fluid state. In alternative embodiments, at operation 426 a vapor phase anneal of the exposed gate dielectric layer is performed at temperatures between 25° C. and 400° C. where the gate dielectric layer surface is exposed to a non-directional vapor of $NH_3$, $N_2H_4$, dimethylhydrazine, or tertbutylhydrazine.

In another embodiment, at operation 428 the gate dielectric layer is exposed to a solid phase nitrogen source. The solid phase nitrogen source may be in the form of any nitrogen containing film conformally deposited over the gate dielectric layer out of which nitrogen may be driven during a subsequent thermal anneal cycle. In one such embodiment, a metal nitride is deposited on the gate dielectric. The metal nitride may be any of those described elsewhere herein in the context of the metal nitride layer 125. For the exemplary embodiments where the channel semiconductor, and hence gate dielectric layer, is highly non-planar (e.g., for the nanowire embodiments), the metal nitride layer 125 is formed (e.g., to 1-2 nm) with an atomic layer deposition (ALD) process. The ALD technique has been found to conformally deposit the metal nitride layer 125 even over bottom nanowire channel surfaces (e.g., 107B in FIG. 1B). In particular embodiments, the metal nitride layer 125 is deposited between 150° C. and 400° C. using alternating pulses of the metal precursor (e.g., Ti, Va, Mo, Ta, W, etc.) and a nitrogen containing co-reactant, such as, $NH_3$, hydrazine, or the like. In further such embodiments, plasma activation is employed during one or more of the nitrogen co-reactant pulses (e.g., only the first pulse, all pulses, etc.). For such cyclic ALD processing, the cycle sequence may be initiated with a first nitrogen containing co-reactant (i.e., prior to a first metal precursor pulse).

In another embodiment, a non-metal nitride is deposited on the gate dielectric. The non-metal nitride may be any conventional nitride dielectric film, such as, but not limited to silicon nitride. In exemplary embodiments, the non-metal nitride deposited is of a composition which can be selectively removed subsequently from the gate dielectric. For the exemplary embodiments where the channel semiconductor, and hence gate dielectric layer, is highly non-planar (e.g., for the nanowire embodiments), the non-metal nitride layer is formed (e.g., to 1-2 nm) with a CVD or ALD process.

One advantage of embodiments enlisting operation 428 is the potentially greater amount of nitrogen that may be incorporated proximate to the gate dielectric layer and/or greater level of control of nitrogen content as it is provided in a metallized alloy state having well-controlled thickness (as opposed to a surface treatment limited to surface termination groups or doping of a given penetration depth of the gate dielectric that is dependent on a number of factors limiting overall control).

Following the operation 428, the solid phase nitrogen doping source material may be removed as a sacrificial film from the gate dielectric surface at operation 430. Such removal may not be necessary where the film added at operation 428 is not to be sacrificial, hence operation 430 is optional, and as such, depicted as a dashed box. One advantage of a sacrificial nitrogen source film is that addition of nitrided metal layers of relatively high resistivity need not be incorporated into the gate electrode stack (e.g., by removing a metal-nitride dopant source material layer). Also, the gate dielectric may maintain a low equivalent oxide thickness (e.g., by removing a silicon nitride dopant source material layer). Stripping of the sacrificial nitrogen dopant source material may be with any etchant conventional to the particular nitrogen dopant source material composition that further offers sufficient selectivity to the gate dielectric. For example, in one embodiment, removal of a silicon nitride layer deposited at operation 428 may proceed with either an isotropic (downstream) plasma etch process, vapor phase etch process, or wet etch process.

Following either (or both) operations 426, 428 (or 430) the method 401 proceeds to operation 486 where a gate metal is deposited in formation of the gate electrode. In the exemplary nanowire channel embodiment, the gate metal is formed at operation 486 with an ALD process for greatest conformality. In embodiments, any of the work function metals and/or bulk metals described elsewhere herein (e.g., for work function metal 120A and bulk metal 120B) are deposited at operation 486. In exemplary embodiments where the nitrogen source for doping gate dielectric is provide through a means other than from the gate electrode, operation 486 entails depositing a work function metal substantially free of nitrogen, or a bulk metal substantially free of nitrogen. In further embodiments, both work function metal and the bulk metal are substantially nitrogen free as-deposited.

In another embodiment, at operation 427 the gate dielectric layer is exposed to a gaseous and/or plasma nitrogen source. For operation 427, a nitridizing plasma of one or more nitrogen source gas, such as, but not limited to, $N_2$, $N_2O$, $NH_3$, and their mixtures with a reactive carrier such as $H_2$ and/or inert such as Ar or He. In the exemplary nanowire channel embodiments, a remote, downstream plasma is utilized for reduced substrate damage and the reduced directionality of the nitrogen dopant species for greater conformality of doping. In one embodiment, plasma exposure at operation 427 entails removing a workpiece from a gate dielectric ALD chamber, and loading the workpiece into a separate processing chamber responsible for the nitrogen doping. Following exposure to the nitrogen source, the workpiece is then moved into a gate metal ALD chamber and operation 486 is performed. Such a method may be considered ex-situ nitridizing plasma.

In another embodiment, operation 427 entails removing a workpiece from a gate dielectric ALD chamber, and loading the workpiece into a gate metal ALD chamber where a nitridizing plasma is provided in-situ as part of a plasma enhanced ALD (PEALD) gate metal deposition process. In this embodiment, the conformal gate metal deposition operation 452 is performed in a manner that also exposes the gate dielectric to a plasma nitrogen source and may further incorporate nitrogen into a layer of the gate metal electrode. As such, this technique is similar to that of operation 428 in that a solid phase nitrogen source may be conformally formed over the gate dielectric. However, whereas operation 428 forms a layer intervening between the gate dielectric and the gate electrode, the gate metal electrode (e.g., a work function metal 120A) is formed directly on the gate dielectric at operation 452. In an embodiment, operation 452 entails at least one exposure of the gate dielectric layer surface to a nitridizing plasma and an organometallic precursor of Ru, Co, Ir, Ni, Pd, or Pt with an intervening chamber purge to both nitrogen dope the gate dielectric and conformally deposit a low resistance gate work function metal. Cycles of the nitridizing plasma and organometallic pulse may also be iterated where doing so does not adversely affect the work function setting properties of the metal.

Following either of the gate metal deposition operations 486 or 452, a thermal anneal is performed at operation 490 and the transistor fabrication is completed at operation 299. The thermal anneal is to motivate solid state diffusion of the nitrogen from the source material (e.g., metal nitride on gate dielectric surface or interface between gate dielectric layer and gate metal layer) to the interface of the III-V channel semiconductor and the gate dielectric layer. During the thermal anneal, nitrogen may accumulate within the gate dielectric proximal to the interface of the III-V semiconductor channel and where more trap states exist. Nitrogen may displace oxygen from a metal oxide or metal silicate and enhance the III-V semiconductor channel resistance latent oxidation of the by species (oxygen) in the dielectric layer, maintaining a chemically sharp semiconductor interface below the gate dielectric layer as the transistor fabrication is complete. During the thermal anneal, some level of up diffusion into the gate metal capping layers may also occur. For example, even where the work function metal and/or bulk metal are substantially free of nitrogen as-deposited, the anneal at operation 490 may diffuse nitrogen from the gate dielectric layer interface with lesser amounts of nitrogen found in the gate metal layer(s) at points more distal from the gate dielectric layer interface.

As the thickness of the gate dielectric layer is very thin (e.g., 1 nm-10 nm), the anneal need not be long or at very high temperatures. Temperatures achieved subsequent to the nitrogen exposure (e.g., operations 426, 427, 428), such as during source drain regrowth if it is performed after gate formation, or even the gate metal deposition operations 486, 452 may be sufficient (e.g., 150° C.-400° C.). Conventional end-of-line N₂ anneals (i.e., post interconnect metallization and passivation), which are typically around 400° C., may also suffice for operation 490. Hence, operation 490 may be implemented as an independent anneal or combined as part of conventional processing at operation 299 to complete the transistor.

Figure 5:
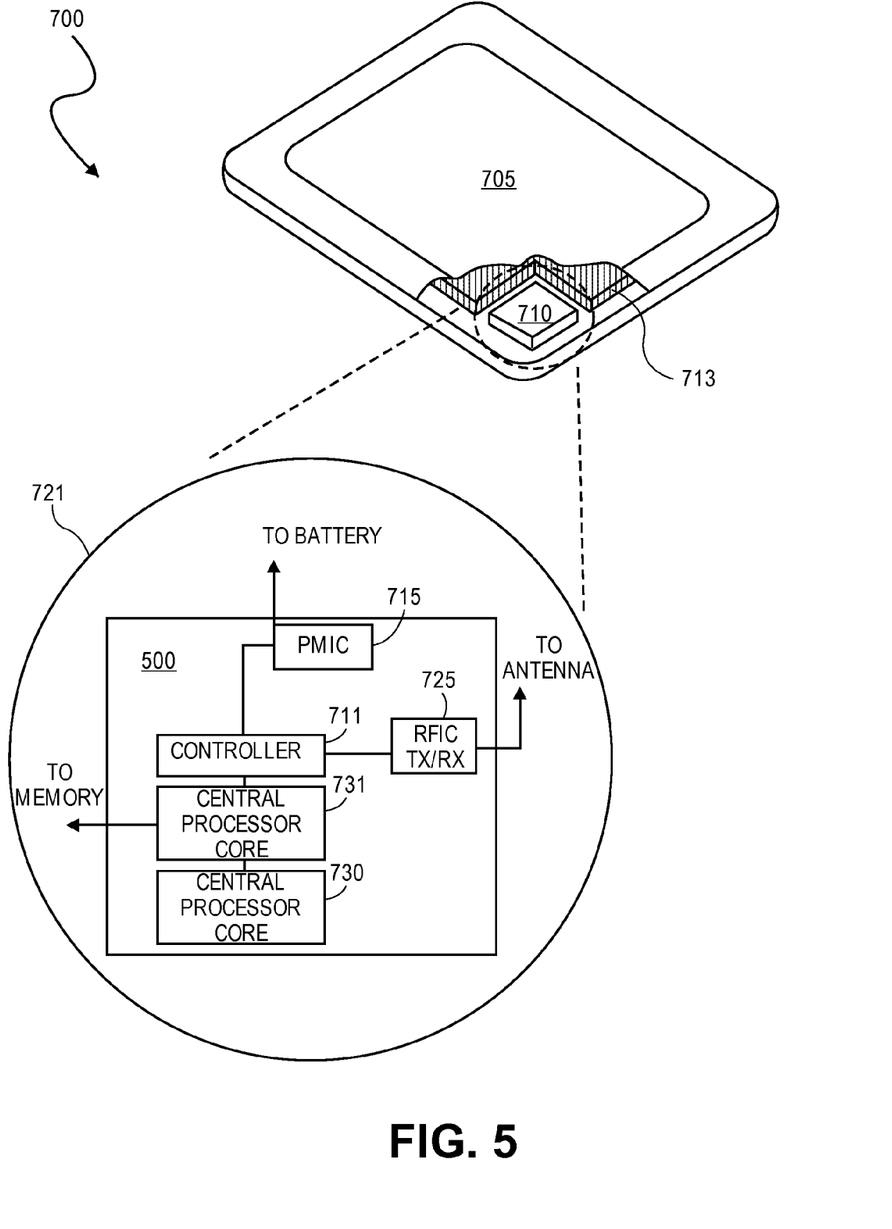
FIG. 5 illustrates an isometric view of a mobile computing device platform and schematic view of a microelectronic device employed by the mobile platform, in accordance with an embodiment of the present invention.

FIG. 5 illustrates an isometric view of a mobile computing device platform 700 and expanded schematic view 721 of a microelectronic device 710 employed by the mobile platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), a chip-level (SoC) or package-level integrated microelectronic device 710, and a battery 713.

The integrated device 710 is further illustrated in the expanded view 721. In the exemplary embodiment, the device 710 includes at least one memory at least one processor chip (e.g., a multi-core microprocessor and/or graphics processor cores 730, 731). In embodiments, a non-planar III-V FET with a nitrogen-doped gate dielectric interface, as described in more detail elsewhere herein (e.g., FIGS. 1A-1D), is integrated into the device 710. The device 710 is further coupled to the board, substrate, or interposer 500 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711. Functionally, the PMIC 715 performs battery power regulation, DC-to-DC conversion, etc., and so has an input coupled to the battery 713 and with an output providing a current supply to all the other functional modules. One or more of the PMIC or RFIC may also include a non-planar III-V FET with a nitrogen-doped gate dielectric interface. In the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In implementations, each of these modules may be integrated onto a single chip as an SoC, onto separate ICs coupled to a package substrate of the packaged device 710, or at a board level.

Figure 6:
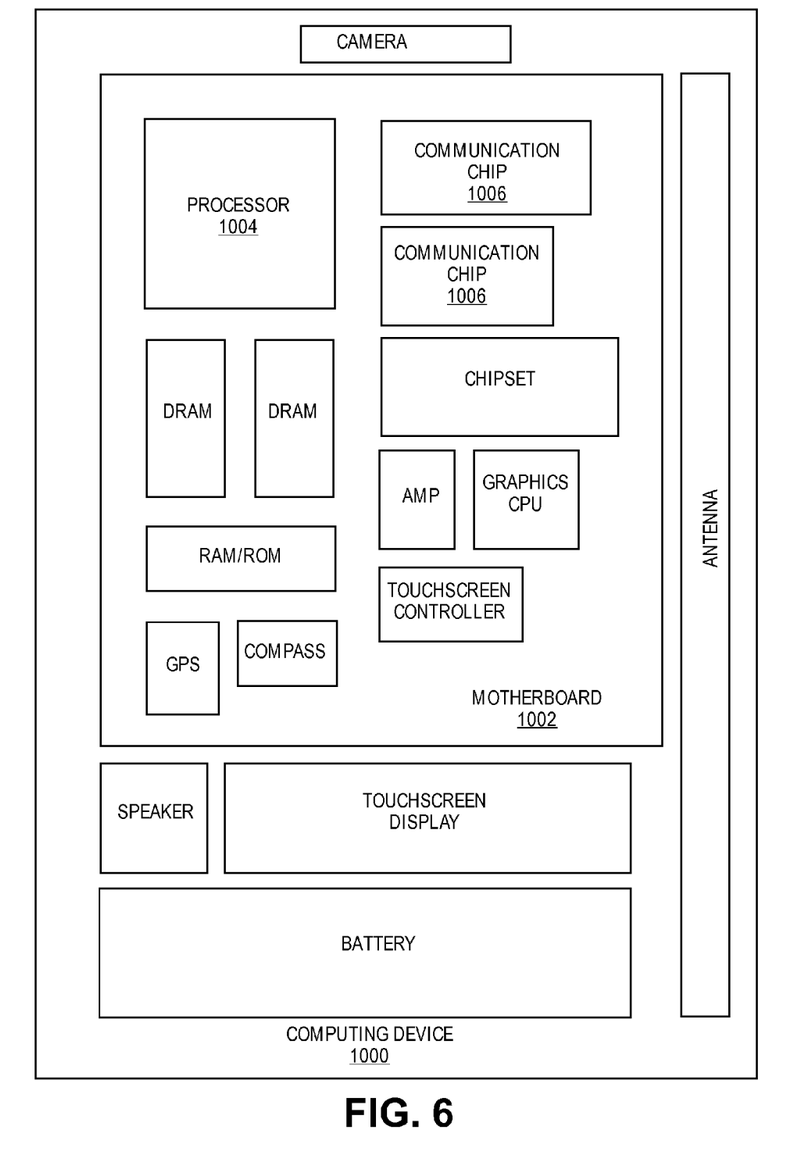
FIG. 6 illustrates a functional block diagram of computing device in accordance with one implementation of the invention.

FIG. 5 is a functional block diagram of a computing device 1000 in accordance with one embodiment of the invention. The computing device 1000 may be found inside the platform 700, for example, and further includes a board 1002 hosting a number of components, such as but not limited to a processor 1004 (e.g., an applications processor) and at least one communication chip 1006. In embodiments, at least the processor 1004 is integrated (e.g., on-chip) with a non-planar III-V FET with a nitrogen-doped gate dielectric interface. The processor 1004 is physically and electrically coupled to the board 1002. The processor 1004 includes an integrated circuit die packaged within the processor 1004. The term "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

Accordingly, one or more embodiments of the present invention relate generally to a non-planar III-V FET with a nitrogen-doped gate dielectric at an interface of a III-V semiconductor surface. It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A non-planar field effect transistor (FET), comprising:
   a source region and a drain region with a III-V semiconductor channel region disposed there between;
   a gate dielectric layer disposed over the semiconductor channel region, wherein the gate dielectric layer comprises a metal oxide, and further comprises nitrogen dopants incorporated in the gate dielectric layer, the nitrogen dopants are proximal an interface between the gate dielectric and the III-V semiconductor channel region; and a gate electrode disposed over the gate dielectric layer.

2. The FET of claim 1, wherein the III-V semiconductor channel region is in direct contact with the gate dielectric, wherein the gate dielectric layer comprises a nitrogen-rich region proximal the interface with the III-V semiconductor channel region, the nitrogen-rich region having more nitrogen relative to a region of the gate dielectric distal from the interface.

3. The FET of claim 2, wherein the semiconductor channel region comprises a wire passing through the gate dielectric layer with the gate dielectric completely wrapping around the channel region and wherein the nitrogen-rich region of the gate dielectric layer also wraps completely around the channel.

4. The FET of claim 1, further comprising a metal nitride layer disposed between the gate electrode and the gate dielectric, the metal nitride interfacing the gate dielectric.

5. The FET of claim 4, wherein the metal nitride comprises at least one of: Ti, V, Mo, Ta, or W.

6. The FET of claim 4, wherein the gate electrode comprises a work function metal disposed over the metal nitride, the work function metal having a composition that sets the work function of the gate electrode in the presence of the metal nitride.

7. The FET of claim 6, wherein the work function metal comprises at least one of: Ru, Co, Ir, Ni, Pd, or Pt.

8. The FET of claim 1, wherein the metal oxide is an oxide of a metal selected from the group consisting of Al, Zr, Hf, Ta and La.

9. The FET of claim 8, wherein the metal oxide is a metal silicate further comprising silicon.

10. A non-planar group III-V field effect transistor (FET), comprising:

a source region and a drain region with a III-V semiconductor nanowire extending there between;

a gate dielectric layer wrapping completely around a length of the III-V semiconductor wire between the source and drain regions, wherein the gate dielectric layer comprises a metal oxide, and further comprises a nitrogen-rich region formed of nitrogen dopants incorporated in the gate dielectric layer, the nitrogen-rich region is proximal an interface between the gate dielectric layer and the semiconductor channel region, the nitrogen-rich region also wrapping around at least a portion of the III-V semiconductor wire; and a metal gate electrode wrapping completely around the gate dielectric layer.

11. The non-planar group III-V field effect transistor (FET) of claim 10, wherein the gate metal comprises a lower concentration of nitrogen than does the nitrogen-rich region of the gate dielectric layer.

12. The non-planar group III-V field effect transistor (FET) of claim 11, further comprising a metal nitride layer disposed between the gate electrode and the gate dielectric, the metal nitride interfacing the gate dielectric.

13. A mobile computing platform comprising:
an integrated circuit comprising the FET of claim 10,
a display screen; and
a wireless transceiver.

* * * * *